United States Patent
Thies et al.

(10) Patent No.: US 7,183,040 B2
(45) Date of Patent: Feb. 27, 2007

(54) RADIATION CURABLE RESIN COMPOSITION AND RAPID PROTOTYPING PROCESS USING THE SAME

(75) Inventors: Jens C Thies, Maastricht (NL); Aylvin J. A. A. Dias, Maastricht (NL); John A. Lawton, Landenberg, PA (US); David L. Winmill, Newark, DE (US); Jigeng Xu, Boothwyn, PA (US); Xiaorong You, Bear, DE (US)

(73) Assignee: DSM IP Assets B.V., Heerlen (NL)

( * ) Notice: Subject to any disclaimer, the term of this patent is extended or adjusted under 35 U.S.C. 154(b) by 0 days.

(21) Appl. No.: 10/623,153

(22) Filed: Jul. 21, 2003

(65) Prior Publication Data
US 2004/0142274 A1 Jul. 22, 2004

Related U.S. Application Data

(63) Continuation of application No. PCT/NL03/00320, filed on May 1, 2003.

(60) Provisional application No. 60/377,239, filed on May 3, 2002.

(51) Int. Cl.
G03F 7/038 (2006.01)
G03F 7/027 (2006.01)

(52) U.S. Cl. ............... 430/280.1; 430/269; 430/18; 264/401

(58) Field of Classification Search .......... 430/280.1, 430/269, 18; 264/401
See application file for complete search history.

(56) References Cited

U.S. PATENT DOCUMENTS

| | | | |
|---|---|---|---|
| 3,708,296 A | 1/1973 | Schlesinger | |
| 3,835,003 A | * 9/1974 | Schlesinger et al. | 430/280.1 |
| 4,751,102 A | 6/1988 | Adair et al. | |
| 4,772,530 A | 9/1988 | Gottschalk et al. | |
| 4,772,541 A | 9/1988 | Gottschalk et al. | |
| 5,002,856 A | 3/1991 | Anderson | |
| 5,476,748 A | 12/1995 | Steinmann | |
| 5,665,792 A | 9/1997 | Lawton et al. | |
| 5,667,937 A | 9/1997 | Lawton et al. | |
| 5,972,563 A | 10/1999 | Steinmann et al. | |

FOREIGN PATENT DOCUMENTS

| | | |
|---|---|---|
| EP | 0 035 969 | 9/1981 |
| EP | 0 044 274 | 1/1982 |
| EP | 0 054 509 | 6/1982 |
| EP | 0 094 914 | 11/1983 |
| EP | 0 094 915 | 11/1983 |
| EP | 0 153 904 | 9/1985 |
| EP | 0 164 314 | 12/1985 |
| EP | 0 223 587 | 5/1987 |
| EP | 938 026 | 8/1999 |
| WO | 96 41238 | 12/1996 |
| WO | 98/28633 | 7/1998 |
| WO | WO 00/63272 A1 * | 10/2000 |
| WO | 01 83580 | 11/2001 |

OTHER PUBLICATIONS

Derwent Publications No. AN 1999-4741112; English abstract of JP 11 199647.

* cited by examiner

*Primary Examiner*—Cynthia Hamilton
(74) *Attorney, Agent, or Firm*—Nixon & Vanderhye P.C.

(57) ABSTRACT

The invention relates to a radiation curable composition comprising relative to the total weight of the composition (A) 0–29 wt % of a cationically curable component having a linking aliphatic ester group, (B) 10–85 wt % of an epoxygroup containing component other than A, (C) 1–50 wt % of an oxetanegroup containing component, (D) 1–25 wt % of a multifunctional acrylate and a radical photoinitiator and a cationic photoinitiator.

22 Claims, No Drawings

RADIATION CURABLE RESIN COMPOSITION AND RAPID PROTOTYPING PROCESS USING THE SAME

CROSS REFERENCE TO RELATED APPLICATIONS

This Application is a continuation of International Application PCT/NL03/00320, filed May 1, 2003, which claims the benefit of U.S. Provisional Application 60/377,239, filed May 3, 2002. Both these prior applications are hereby incorporated in their entirety by reference.

FIELD OF THE INVENTION

The present invention relates to radiation curable compositions which are particularly suitable for the production of three-dimensional shaped articles by means of stereolithography, to a process for the production of a cured product and, in particular, for the stereolithographic production of a three dimensional shaped articles from this composition having excellent moisture resistance.

BACKGROUND OF THE INVENTION

The production of three-dimensional articles of complex shape by means of stereolithography has been known for a number of years. In this technique the desired shaped article is built up from a radiation-curable composition with the aid of a recurring, alternating sequence of two steps (a) and (b). In step (a), a layer of the radiation-curable composition, one boundary of which is the surface of the composition, is cured with the aid of appropriate imaging radiation, preferably imaging radiation from a computer-controlled scanning laser beam, within a surface region which corresponds to the desired cross-sectional area of the shaped article to be formed, and in step (b) the cured layer is covered with a new layer of the radiation-curable composition, and the sequence of steps (a) and (b) is repeated until a so-called green model of the desired shape is finished. This green model is, in general, not yet fully cured and may therefore be subjected to post-curing, though such post curing is not required.

Via an equivalent process, photopolymer can be jetted by ink jet or multiple ink jet processes in an imagewise fashion. While jetting the photopolymer or after the photopolymer is applied actinic exposure can be provided to initiate polymerization. Multiple materials (for example non-reactive waxes, weakly reacting photopolymers, photopolymers of various physical properties, photopolymers with various colors or color formers, etc.) can be jetted or applied to provide supports or alternate cured properties.

The mechanical strength of the green model (modulus of elasticity, fracture strength), also referred to as green strength, constitutes an important property of the green model and is determined essentially by the nature of the stereolithographic-resin composition employed in combination with the type of stereolithography apparatus used and degree of exposure provided during part fabrication. Other important properties of a stereolithographic-resin composition include a high sensitivity for the radiation employed in the course of curing and a minimum amount of curl or shrinkage deformation, permitting high shape definition of the green model. In addition, for example, it should be relatively easy to coat a new layer of the stereolithographic resin composition during the process. And of course, not only the green model but also the final cured article should have optimum mechanical properties.

The developments in this area of technology move towards compositions having better mechanical properties in order to better simulate properties of commodity materials like polypropylene and engineering type polymers. Also there exists a requirement for faster cure and process speeds, so as to decrease the time to built a part. This has resulted in new stereolithography machines having solid state lasers that have a high energy output, very fast laser-scanning and faster recoating processes. The new machines supply UV light with a power around 800 mW and above, compared to 200–300 mW for the older conventional machines. Also the scanning time is reduced by 3 to 4 times. These high powers, high scanning speeds, and short recoating times result in higher temperatures, due to polymerization exotherm of the resins and parts during fabrication. Typical temperatures have risen to values between 50 and 90° C., which leads to part distortion and excessive color development.

The developments have resulted in compositions having a substantial amount of 3,4-epoxycyclohexylmethyl-3,4-epoxycyclohexanecarboxylate, together with other components like polyols, acrylates and glycidylethers. Examples of such compositions can be found in for example U.S. Pat. No. 5,476,748. A disadvantage of such compositions is that cured parts show poor mechanical properties, when subjected to high humidity environments or when they are soaked in water for longer periods of time.

JP Hei 11-199647 shows examples of hybrid compositions, containing oxetanes, 38–50 wt % 3,4-epoxycyclohexylmethyl-3,4-epoxycyclohexanecarboxylate and more than 35 wt % of acrylates. These compositions have the disadvantage that the green model parts show unacceptable high distortion when made in a high power solid state stereolithography apparatus, whereby the parts also are very sensitive to water or high humidity.

OBJECTS OF THE INVENTION

It is an object of the present invention to provide resin compositions that after full cure show improved resistance to moisture or humidity.

It is another objective to provide objects made from resin compositions that substantially keep their mechanical properties when subjected to water or high humidity conditions for a long time.

It is also an object of the invention to provide resin compositions that can be easily used in solid state laser stereolithography machines.

It is a further objective of the invention to provide resin compositions that show excellent mechanical properties (such as modulus, izod and flexibility) and low curl behavior when cured in a stereolithography machine.

SUMMARY OF THE INVENTION

The present invention relates to a radiation curable composition comprising

A 0–29 wt % of a cationically curable component having a linking aliphatic ester group B 10–85 wt % of an epoxygroup containing component other than A C 1–50 wt % of an oxetanegroup containing component D 1–25 wt % of a multifunctional acrylate E a radical photoinitiator F a cationic photoinitiator A cationically curable component having a linking aliphatic ester group is a component having at least two cationically curable functional groups and one ester group, which ester group is located between two cationically curable functional groups and is coupled at both sides to aliphatic carbon atoms. The at least two cationically curable functional groups may be the same or different. Examples of cationically curable functional groups are epoxy, oxetane and hydroxy groups.

A preferred embodiment of the present invention involves a radiation curable composition comprising relative to the total of the composition A 0–25 wt % of a component having a linking estergroup and two cyclohexeneoxide groups
B 10–80 wt % of an epoxygroup containing component other than A
C 1–50 wt % of an oxetanegroup containing component
D 1–25 wt % of a multifunctional acrylate
E 0,1–10 wt % of a radical photoinitiator
F 0,1–10 wt % of a cationic photoinitiator wherein a photo-fabricated article, obtained by repeating the steps of forming a layer of the composition and selectively irradiating the layer of the composition with actinic radiation, followed by postcure during 60 minutes in a postcure apparatus and subsequent conditioning of the article during 48 hours at a temperature of 20° C. and a relative humidity of 80% RH, has at least one of the following properties
(i) a flexural modulus in the range of 500 to 10000 MPa;
(ii) an average elongation at break of at least 3%; and/or
(iii) a tensile strenght of at least 25 MPa A different embodiment of the present invention relates to a radiation curable composition, comprising an oxetane, a glycidylether, a cationic photoinitiator, wherein the composition is cured to a flexural bar having the approximate dimensions of 5.5 mm thickness, a width of 12.5 mm and a length of 150 mm, with actinic radiation and 60 min UV postcure and wherein the object has a ratio of Fwet/Fdry>0.5, wherein Fdry is the Flexural Modulus of the flexural bar after cure and Fwet is the Flexural Modulus of a flexural bar after cure and a water treatment, wherein the object is submersed in water of 20° C. during 48 hours.

In a further embodiment, the present invention features a radiation curable composition, comprising an oxetane, a glycidylether, a cationic photoinitiator, wherein the composition after cure with actinic radiation and 60 min UV postcure shows the following properties:
(i) a water absorption of less than 1 wt % after conditioning of a part, having a length of 15 cm, a height of 0.55 cm and a width of 1,25 cm during 48 hours and a temperature of 20° C. at a relative humidity of 80%
(ii) a flexural modulus in the range of 500 to 10000 MPa; and
(iii) an average elongation at break of at least 3%.

Preferably the radiation curable composition comprises an oxetane, a glycidylether, a cationic photoinitiator, 0–20 wt % of cationically curable components having a linking aliphatic ester group, wherein the composition after full cure by actinic radiation and 60 min UV postcure has at least one of the following properties
(i) a flexural modulus in the range of 1000 to 10000 MPa;
(ii) an average elongation at break of at least 4%; and
(iii) a tensile strength of at least 25 Mpa.

The present invention also provides processes, e.g. a rapid prototyping process, for curing the present compositions. In addition, the present invention provides objects, e.g. three dimensional objects, obtained by such processes.

DETAILED DESCRIPTION OF THE INVENTION

While not wishing to be limited by any particular theory, it is believed that the presence of high amounts of components, that have linking aliphatic ester groups in the molecule, that form chemical bridges in the object after cure of the compositions, may be unfavorable for the moisture (i.e. water) resistance of the objects. Such aliphatic ester groups are believed to be hydrolytically unstable in the presence of acids and may cause loss of mechanical properties after being subjected to water or high humidity conditions for longer periods of time and/or at higher temperatures. Accordingly, the present invention relates to radiation curable compositions that comprise a limited amount of cationically curable components having such linking aliphatic ester groups.

(A) Cationically Polymerizable Component

The present invention comprises at least one epoxide-group containing compound as a cationically polymerizable component Epoxide-containing materials, also referred to as epoxy materials, are cationically curable, by which is meant that polymerization and/or crosslinking and other reactions of the epoxy group can be initiated by cations. These materials may be monomers, oligomers or polymers and are sometimes referred to as "resins." Such materials may have an aliphatic, aromatic, cycloaliphatic, arylaliphatic or heterocyclic structure. They can comprise epoxy groups as side groups or groups that form part of an alicyclic or heterocyclic ring system. Epoxy resins of those types include those that are generally known and are commercially available.

The composition may contain one or more epoxy resins. Preferably, the composition will comprise at least one liquid (at room temperature, 23° C.) component such that the combination of materials is a liquid. Thus, the epoxide-containing material is preferably a single liquid epoxy material, a combination of liquid epoxy materials, or a combination of liquid epoxy material(s) and solid epoxy material(s) which is soluble in the liquid. However, in certain other preferred embodiments, e.g. in embodiments where the epoxide material is soluble in other components of the composition, the epoxide material may be comprised only of materials that are solid at room temperature. Also, when solid compositions are used, the compositions may be melted prior to or during use. It is also possible to use shear thinning compositions, that show a relatively high viscosity in the absence of shear but show a much lower viscosity during and (shortly after) shear.

The amount of epoxy group containing components that have linking aliphatic ester groups preferably is below 25 wt % of the total weight of the composition. Preferably the amount of epoxy group containing components that have linking aliphatic ester groups is below 20 wt %, more preferably below 15 wt % of the total composition.

In one embodiment, the amount of cationically curable compounds having ester linking groups may be described in terms of equivalents or milliequivalents ester groups per 100 grams of total composition. The ester milliequivalent of a component is calculated with the formula:

$$\text{ester milliequivalents of a component } Z = \frac{\text{Wt \%} * 1000}{N * Mwt}$$

wherein wt %=wt % of the component Z relative to the total composition, N=Number of linking ester groups of the component Z and Mwt is molecular weight of component Z.

The ester milliequivalents of the total composition is calculated by adding up the individual milliequivalent values of the cationically curable components that have linking estergroups.

The milliequivalent linking ester groups in the composition is preferably below 100 meq of ester links/100 g of composition. More preferably the amount of linking ester groups is below 50 meq/100 g composition. Most preferably (in view of hydrolytic stability) the amount of linking ester groups is below 25 meq/100 g composition.

For further improved hydrolytic stability of the part, it is preferred that the compositions do not have cationically curable compounds having linking aliphatic ester groups.

Examples of epoxy group containing components that have linking aliphatic ester groups are components having a linking aliphatic estergroup and two cyclohexeneoxide groups like for example 3,4-epoxy-6-methylcyclohexylmethyl-3,4-epoxy-6-methylcyclohexanecarboxylate, di(3,4-epoxycyclohexylmethyl)hexanedioate, di(3,4-epoxy-6-methylcyclohexylmethyl)hexanedioate, 3,4-epoxycyclohexylmethyl-3,4-epoxycyclohexanecarboxylate and ethylenebis(3,4-epoxycyclohexanecarboxylate).

Preferably the composition of the present invention contains a substantial amount of epoxy materials (component B) other than the epoxy group containing components that have linking aliphatic ester groups.

Examples of suitable (component B) epoxy materials include polyglycidyl and poly(methylglycidyl) esters of aromatic polycarboxylic acids, or poly(oxiranyl) ethers of polyethers. Examples of aromatic polycarboxylic acids are phthalic acid, isophthalic acid, trimellitic acid, or pyromellitic acid. The polyether can be for example poly(tetramethylene oxide).

Suitable (component B) epoxy materials also include polyglycidyl or poly(-methylglycidyl) ethers obtainable by the reaction of a compound having at least one free alcoholic hydroxy group and/or phenolic hydroxy group and a suitably substituted epichlorohydrin. The alcohols can be acyclic alcohols, such as, for example, C2–C30 alkanols, alkoxylated alcohols, polyols such as for example 1,4-butanediol, trimethylol propane, neopentylglycol, dibromo neopentyl glycol, ethylene glycol, diethylene glycol, and higher poly(oxyethylene) glycols; cycloaliphatic, such as, for example, 1,3- or 1,4-dihydroxycyclohexane, cyclohexane dimethanol, bis(4-hydroxycyclohexyl)methane, 2,2-bis(4-hydroxycyclohexyl)propane, or 1,1-bis(hydroxymethyl)cyclohex-3-ene; or contain aromatic nuclei, such as N,N-bis(2-hydroxyethyl)aniline or p,p'-bis(2-hydroxyethylamino)diphenylmethane.

Other suitable (component B) epoxy compounds include those which may be derived from mono nuclear phenols, such as, for example, resorcinol or hydroquinone, or they may be based on polynuclear phenols, such as, for example, bis(4-hydroxyphenyl)methane (bisphenol F), bis(4-hydroxyphenyl)S (Bisphenol S), 2,2-bis(4-hydroxyphenyl)propane (bisphenol A), alkoxylated bisphenol A, F or S, triol extended bisphenols A, F or S, and brominated bisphenols A, F or S; glycidyl ethers of phenols and phenols with pendant groups and chains; or on condensation products, obtainable under acidic conditions, of phenols or cresols with formaldehyde, such as phenol novolacs and cresol novolacs, as well as dicyclopentadiene backbone phenol glycidyl ethers and tris(hydroxyphenyl) methane-based epoxies.

Suitable (component B) epoxy materials also include poly(N-glycidyl) compounds, which are, for example, obtainable by dehydrochlorination of the reaction products of epichlorohydrin with amines that comprise at least two amine hydrogen atoms, such as, for example, n-butylamine, aniline, toluidine, m-xylylene diamine, bis(4-aminophenyl)methane or bis(4-methylaminophenyl)methane. Suitable poly(N-glycidyl) compounds also include N,N'-diglycidyl derivatives of cycloalkyleneureas, such as ethyleneurea or 1,3-propyleneurea, and N,N'-diglycidyl derivatives of hydantoins, such as of 5,5-dimethylhydantoin.

Examples of suitable (component B) epoxy materials include poly(S-glycidyl) compounds which are di-S-glycidyl derivatives which are derived from dithiols, such as, for example, ethane-1,2-dithiol or bis(4-mercaptomethylphenyl) ether.

Preferred component B epoxies are glycidyl epoxides of saturated and unsaturated bisphenol A, F, and S including alkoxylated bisphenol A, F, and S, triol extended bisphenols, and brominated bisphenols; glycidyl ethers of C2–C30 alkyls; 1,2 epoxies of C3–C30 alkyls such as tetradecane oxide; glycidyl ethers of phenols and phenols with pendant groups and chains; mono and multi glycidyl ethers of alcohols and polyols such as 1,4-butanediol, neopentyl glycol, cyclohexane dimethanol, dibromo neopentyl glycol, trimethylol propane, poly-THF, polyethylene oxide, polypropylene oxide, glycerol, and alkoxylated alcohols and polyols. Also preferred are epoxidized phenolic, cresolic, and bisphenol-based novolacs, as well as dicyclopentadiene backbone phenol glycidyl ethers and tris(hydroxyphenyl) methane-based epoxies. Other examples of preferred epoxides are ortho-glycidyl phenyl glycidyl ether, diglycidyl ether of resorcinol, triglycidyl ether of phloroglucinol and substituted phloroglucinols, 2,6-(2,3-epoxypropyl) phenylglycidyl ether, diglycidyl ether of bisphenol-hexafluoroacetone, diglycidyl ether of 2,2-bis(4-hydroxyphenyl)nonadecane, 4,4-bis(2,3-epoxypropyl)phenyl ether, diglycidyl ether of tetrachlorobisphenol A, diglycidyl ether of tetrabromobisphenol A, triglycidyl ether of trihydroxybiphenyl, tetraglycidoxy biphenyl, tetraglycidyl ether of bisresorcinol F, tetraglycidyl ether of resorcinol ketone, 3,9-bis[2-(2,3-epoxypropoxy)phenylethyl]-2,4,8,10-tetraoxaspiro[5,5]undecane, triglycidoxy-1,1,3-triphenylpropane, tetraglycidoxy tetraphenylethane, 1,3-bis[3-(2,3-epoxypropoxy)propyl]tetramethyldisiloxane, polyepichlorohydrin di(2,3-epoxypropyl)ether, polyallyl glycidyl ether, epoxidized cyclic silanes such as 2,4,6,8,10-pentakis[3-(2,3-epoxypropoxy)propyl]-2,4,6,8,10-pentamethylcyclopentasiloxane, diglycidyl ether of chlorendic diol, diglycidyl ether of dioxanediol, diglycidyl ether of endomethylene cyclohexanediol, 2,2-bis[4-2,3-epoxypropyl)cyclohexyl]propane, 1,1,1-tris(para-hydroxyphenyl)ethane glycidyl ether, and 2,2-(4-[3-chloro-2-(2,3-epoxypropoxy)propoxyl]cyclohexyl)propane.

Examples of preferred component B cycloaliphatic epoxides are vinylcyclohexene dioxide, limonene oxide and dioxide, 2,2-bis(3,4-epoxycyclohexyl)propane, Bis(2,3-epoxycyclopentyl)ether, ethanedioldi(3,4-epoxycyclohexylmethyl) ether, dicyclopentadiene dioxide, 1,2-epoxy-6-(2,3-epoxypropoxy)hexahydro-4,7-methanoindane, para-(2,3-epoxy)cyclopentylphenyl-2,3-epoxypropyl ether, epoxydicyclopentenylphenyl glycidyl ether, ortho-epoxycyclopentenylphenylglycidyl ether, bisepoxydicyclopentyl ether of ethylene glycol, and 2-(3,4-epoxy)cyclohexyl-5,5-spiro(3,4-epoxy)-cyclohexane-meta-dioxane.

The epoxy materials can have molecular weights that vary over a wide range. In general, the epoxy equivalent weight, i.e., the number average molecular weight divided by the number of reactive epoxy groups, is preferably in the range of 60 to 1000.

Preferably the compositions of the present invention have a weight ratio of glycidylethers to epoxy group containing components that have linking aliphatic ester groups of larger than 1, preferably larger than 1,5, more preferably larger than 2.

The compositions of the present invention preferably contain 10–85 wt % glycidylether compounds, more preferably between 20 and 80 wt %, most preferably between 30 and 75 wt %, relative to the total of the composition.

(C) Oxetane Group Containing Component

Preferably the compositions of the present invention contain oxetanes. The presence of oxetanes in combination with glycidylethers enhances the cure speed of the compositions relative to compositions having only glycidylethers but no oxetanes. Therefore the resin compositions of the present invention may be advantageously employed in high powered stereolithography machines having solid state lasers. Also, the presence of oxetanes improves the flexibility of the objects made from the composition. Furthermore it has been surprisingly found that the presence of oxetanes gives a higher accuracy of object formation, less curling and deformation during the build of the part. It has also been unexpectedly found that the greenstrength of the parts increases significantly when oxetanes are present in the composition in ranges between 1 and 29 wt %.

It has surprisingly been found that a molar ratio of oxetane to glycidylether is preferred from the viewpoint of reactivity if the molar ratio of oxetane to glycidylether is between 0.1 and 1.5, more preferably between 0.2 and 1.0. Within these ranges, an unexpectedly high reactivity of the composition towards actinic radiation is observed.

An oxetane compound comprises at least one oxetane ring shown by the following formula (1).

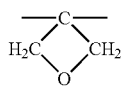

(1)

The oxetane compound can be polymerised or crosslinked by irradiation with light in the presence of a cationically polymerizable photoinitiator. The oxetane, or oxetane compound, may comprise one or more oxetane rings.

Examples of oxetanes having one oxetane ring in the molecule, are shown by the following formula (2):

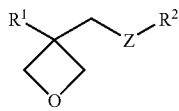

(2)

wherein Z represents an oxygen atom or sulphur atom; $R^1$ represents a hydrogen atom, fluorine atom, an alkyl group having 1–6 carbon atoms such as a methyl group, ethyl group, propyl group, and butyl group, a fluoroalkyl group having 1–6 carbon atoms such as trifluoromethyl group, perfluoroethyl group, and perfluoropropyl group, an aryl group having 6–18 carbon atoms such as a phenyl group and naphthyl group, a furyl group, or a thienyl group; and $R^2$ represents a hydrogen atom, an alkyl group having 1–6 carbon atoms for example a methyl group, ethyl group, propyl group, and butyl group, an alkenyl group having 2–6 carbon atoms for example a 1-propenyl group, 2-propenyl group, 2-methyl-1-propenyl group, 2-methyl-2-propenyl group, 1-butenyl group, 2-butenyl group, and 3-butenyl group, an aryl group having 6–18 carbon atoms for example a phenyl group, naphthyl group, anthranyl group, and phenanthryl group, a substituted or unsubstituted aralkyl group having 7–18 carbon atoms for example a benzyl group, fluorobenzyl group, methoxy benzyl group, phenethyl group, styryl group, cynnamyl group, ethoxybenzyl group, a group having other aromatic rings for instance an aryloxyalkyl for example a phenoxymethyl group and phenoxyethyl group, an alkylcarbonyl group having 2–6 carbon atoms for example an ethylcarbonyl group, propylcarbonyl group, butylcarbonyl group, an alkoxy carbonyl group having 2–6 carbon atoms for example an ethoxycarbonyl group, propoxycarbonyl group, butoxycarbonyl group, an N-alkylcarbamoyl group having 2–6 carbon atoms such as an ethylcarbamoyl group, propylcarbamoyl group, butylcarbamoyl group, pentylcarbamoyl group, or a polyethergroup having 2–1000 carbon atoms.

Examples of oxetane compounds having two oxetane rings in the molecule are compounds shown by the following formula (3):

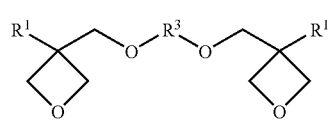

(3)

wherein $R^1$ is the same as defined for the above formula (2); $R^3$ represents a linear or branched alkylene group having 1–20 carbon atoms for example an ethylene group, propylene group, and butylene group, a linear or branched poly(alkyleneoxy) group having 1–120 carbon atoms for example a poly(ethyleneoxy) group and poly(propyleneoxy) group, a linear or branched unsaturated hydrocarbon group for example a propenylene group, methylpropenylene group, and butenylene group; and $R^3$ may be a polyvalent group selected from groups shown by the following formulas (4), (5), and (6):

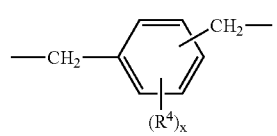

(4)

wherein $R^4$ represents an alkyl group having 1–4 carbon atoms, an alkoxy group having 1–4 carbon atoms, a halogen atom for example a chlorine atom or bromine atom, a nitro group, cyano group, mercapto group, carboxyl group, or carbamoyl group, and x is an integer from 0–4;

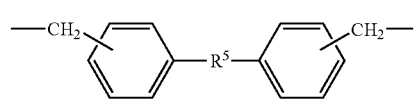

(5)

wherein $R^5$ represents an oxygen atom, sulphur atom, methylene group, —NH—, —SO—, —SO2—, —C(CF3)2—, or —C(CH3)2—;

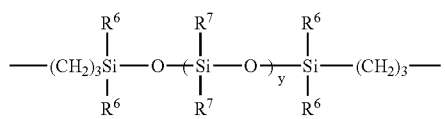 (6)

wherein R6 represents an alkyl group having 1–4 carbon atoms or an aryl group having 6–18 carbon atoms for example a phenyl group or naphthyl group, y is an integer from 0–200, and R7 represents analkyl group having 1–4 carbon atoms, an aryl group having 6–18 carbon atoms for example a phenyl group or naphthyl group, or a group shown by the following formula (7):

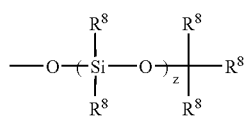 (7)

wherein R8 represents an alkyl group having 1–4 carbon atoms or an aryl group having 6–18 carbon atoms for example a phenyl group or naphthyl group, and z is an integer from 0–100.

As specific examples of the compounds having two oxetane rings in the molecule, compounds shown by the following formulas (9), and (10) can be given.

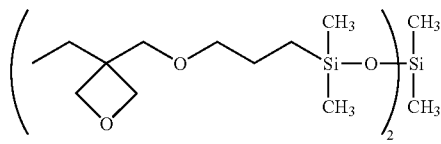 (9)

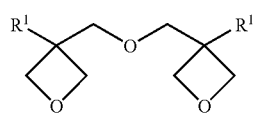 (10)

In the formula (10), R1 is the same as defined for the above formula (2).

Examples of the compounds having three or more oxetane rings in the molecule are compounds represented by formula (11):

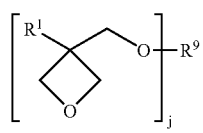 (11)

wherein R1 is the same as defined for the above formula (2); R9 represents an organic group with a valence of 3–10.

Specific examples of compounds having three or more oxetane rings in the molecule are compounds shown by the following formula (18):

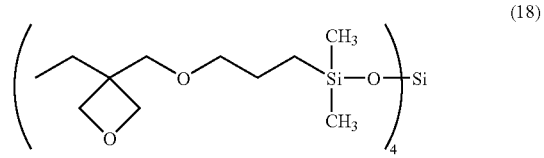 (18)

Compounds shown by the following formula (19) may comprise 1–10 oxetane rings:

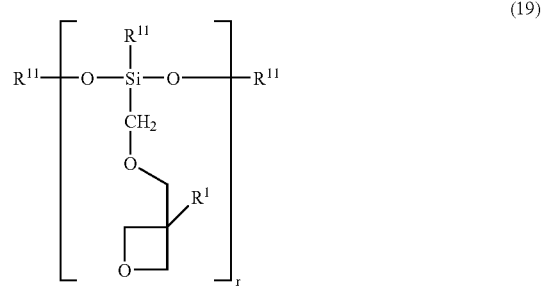 (19)

wherein R1 is the same as defined for the formula (2), R8 is the same as defined for the formula (7), R11 represents an alkyl group having 1–4 carbon atoms or trialkylsilyl group (wherein each alkyl group individually is an alkyl group having 1–12 carbon atom), for example a trimethylsilyl group, triethylsilyl group, tripropylsilyl group, or tributylsilyl group, and r is an integer from 1–10.

Furthermore, other than the above-mentioned compounds, compounds having a polystyrene-reduced number average molecular weight measured by gel permeation chromatography of 1,000–5,000 can be given as examples of the oxetane compound (A). As examples of such compounds, compounds shown by the following formulas (20), (21), and (22) can be given:

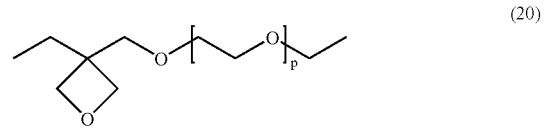 (20)

wherein p is an integer from 20–200:

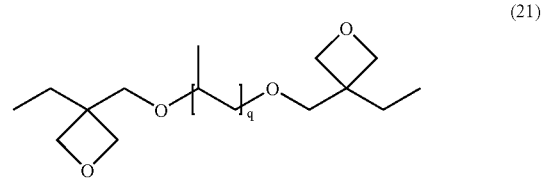 (21)

wherein q is an integer from 15–100:

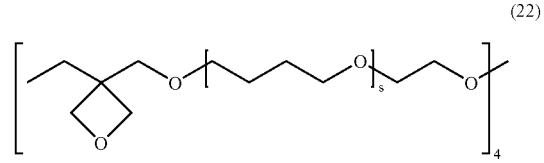 (22)

wherein s is an integer from 20–200.

Specific examples of the above-described oxetane compounds are given below.

Compounds containing one oxetane ring in the molecule: 3-ethyl-3-hydroxymethyloxetane, 3-(meth)allyloxymethyl-3-ethyloxetane, (3-ethyl-3-oxetanylmethoxy)methylbenzene, (3-ethyl-3-oxetanylmethoxy)benzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl] phenyl ether, isobutoxymethyl (3-ethyl-3-oxetanylmethyl) ether, isobornyloxyethyl (3-ethyl-3-oxetanylmethyl) ether, isobornyl (3-ethyl-3-oxetanylmethyl) ether, 2-ethylhexyl (3-ethyl-3-oxetanylmethyl) ether, ethyldiethylene glycol (3-ethyl-3-oxetanylmethyl) ether, dicyclopentadiene (3-ethyl-3-oxetanylmethyl) ether, dicyclopentenyloxyethyl (3-ethyl-3-oxetanyl methyl) ether, dicyclopentenyl (3-ethyl-3-oxetanylmethyl) ether, tetrahydrofurfuryl (3-ethyl-3-oxetanylmethyl) ether, tetrabromophenyl (3-ethyl-3-oxetanylmethyl) ether, 2-tetrabromophenoxyethyl (3-ethyl-3-oxetanylmethyl) ether, tribromophenyl (3-ethyl-3-oxetanylmethyl) ether, 2-tribromophenoxyethyl (3-ethyl-3-oxetanylmethyl) ether, 2-hydroxyethyl (3-ethyl-3-oxetanyl methyl) ether, 2-hydroxypropyl (3-ethyl-3-oxetanylmethyl) ether, butoxyethyl (3-ethyl-3-oxetanylmethyl) ether, pentachlorophenyl (3-ethyl-3-oxetanylmethyl) ether, pentabromophenyl (3-ethyl-3-oxetanylmethyl) ether, bornyl (3-ethyl-3-oxetanylmethyl) ether.

Compounds containing two or more oxetane rings in the molecule: 3,7-bis(3-oxetanyl)-5-oxa-nonane, 3,3'-(1,3-(2-methylenyl)propanediylbis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methy]propane, ethylene glycol bis(3-ethyl-3-oxetanylmethyl) ether, dicyclopentenyl bis(3-ethyl-3-oxetanylmethyl) ether, triethylene glycol bis(3-ethyl-3-oxetanylmethyl) ether, tetraethylene glycol bis (3-ethyl-3-oxetanylmethyl) ether, tricyclodecanediyldimethylene (3-ethyl-3-oxetanylmethyl) ether, trimethylolpropane tris(3-ethyl-3-oxetanylmethyl) ether, 1,4-bis(3-ethyl-3-oxetanylmethoxy)butane, 1,6-bis(3-ethyl-3-oxetanylmethoxy) hexane, pentaerythritol tris(3-ethyl-3-oxetanylmethyl) ether, pentaerythritol tetrakis(3-ethyl-3-oxetanylmethyl) ether, polyethylene glycol bis(3-ethyl-3-oxetanylmethyl) ether, dipentaerythritol hexakis(3-ethyl-3-oxetanylmethyl) ether, dipentaerythritol pentakis(3-ethyl-3-oxetanylmethyl) ether, dipentaerythritol tetrakis(3-ethyl-3-oxetanylmethyl) ether, caprolactone-modified dipentaerythritol hexakis(3-ethyl-3-oxetanylmethyl) ether, caprolactone-modified dipentaerythritol pentakis(3-ethyl-3-oxetanylmethyl) ether, ditrimethylolpropane tetrakis(3-ethyl-3-oxetanylmethyl) ether, EO-modified bisphenol A bis(3-ethyl-3-oxetanylmethyl) ether, PO-modified bisphenol A bis(3-ethyl-3-oxetanylmethyl) ether, EO-modified hydrogenated bisphenol A bis(3-ethyl-3-oxetanylmethyl) ether, PO-modified hydrogenated bisphenol A bis(3-ethyl-3-oxetanylmethyl) ether, EO-modified bisphenol F (3-ethyl-3-oxetanylmethyl) ether. These compounds can be used either individually or in combination of two or more.

Preferred oxetanes are selected from the group consisting of components defined by formula 2, wherein $R^1$ is a C1–C4 alkyl group, Z=Oxygen and $R^2$=H, a C1–C8 alkyl group or a phenylgroup; 3-ethyl-3-hydroxymethyloxetane, (3-ethyl-3-oxetanylmethoxy)methylbenzene, (3-ethyl-3-oxetanylmethoxy)benzene, 2-ethylhexyl (3-ethyl-3-oxetanyl methyl) ether, 1,4-bis[(3-ethyl-3-oxetanylmethoxy)methyl]benzene, 1,2-bis[(3-ethyl-3-oxetanylmethoxy)methyl]ethane, 1,3-bis [(3-ethyl-3-oxetanylmethoxy)methyl]propane, ethylene glycol bis(3-ethyl-3-oxetanylmethyl) ether and bis(3-ethyl-3-oxetanylmethyl) ether.

The oxetane compounds can be used either individually or in combinations of two or more.

The content of the oxetane compound in the resin composition of the present invention is preferably 1–50 wt %, more preferably 3–29 wt % and still more preferably 10–25 wt %, relative to the total composition.

Other cationically polymerizable components that may be used in the composition of the present invention include, for instance, cyclic ether compounds, cyclic lactone compounds, cyclic acetal compounds, cyclic thioether compounds, spiro orthoester compounds, and vinylether compounds.

It is of course possible to use mixtures of cationically polymerizable components in the compositions according to the invention.

Preferably the composition of the present invention comprises, relative to the total weight of the composition, at least 20 wt %, more preferably at least 40 wt %, and most preferably at least 60 wt % of cationically curable components.

Preferably the composition of the invention comprises, relative to the total weight of the composition, less than 95 wt %, more preferably less than 90 wt % cationically curable components.

(D) Multifunctional Acrylate Compound

The composition of the present invention may also contain radically polymerizable compounds. Suitable examples of radical polymerizable compounds are compounds having one or more ethylenically unsaturated groups, like for example compounds having acrylate or methacrylate groups.

Examples of monofunctional ethylenically unsaturated compounds include acrylamide, (meth)acryloylmorpholine, 7-amino-3,7-dimethyloctyl (meth)acrylate, isobutoxymethyl(meth)acrylamide, isobornyloxyethyl (meth)acrylate, isobornyl (meth)acrylate, 2-ethylhexyl (meth)acrylate, ethyldiethylene glycol (meth)acrylate, t-octyl (meth)acrylamide, diacetone (meth)acrylamide, dimethylaminoethyl (meth)acrylate, diethylaminoethyl (meth)acrylate, lauryl (meth)acrylate, dicyclopentadiene (meth)acrylate, dicyclopentenyloxyethyl (meth)acrylate, dicyclopentenyl (meth) acrylate, N,N-dimethyl(meth)acrylamidetetrachlorophenyl (meth)acrylate, 2-tetrachlorophenoxyethyl (meth)acrylate, tetrahydrofurfuryl (meth)acrylate, tetrabromophenyl (meth) acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydroxypropyl (meth) acrylate, vinylcaprolactam, N-vinylpyrrolidone, phenoxyethyl (meth)acrylate, butoxyethyl (meth)acrylate, pentachlorophenyl (meth)acrylate, pentabromophenyl (meth)acrylate, polyethylene glycol mono(meth)acrylate, polypropylene glycol mono(meth)acrylate, bornyl (meth)acrylate and, methyltriethylene diglycol (meth)acrylate.

Examples of the polyfunctional radically polymerizable compounds include ethylene glycol di(meth)acrylate, dicyclopentenyl di(meth)acrylate, triethylene glycol diacrylate, tetraethylene glycol di(meth)acrylate, tricyclodecanediyldimethylene di(meth)acrylate, trimethylolpropane tri(meth)acrylate, ethylene oxide (hereinafter may be abbreviated as "EO") modified trimethylolpropane tri(meth)acrylate, propylene oxide (hereinafter may be abbreviated as "PO") modified trimethylolpropane tri(meth)acrylate, tripropylene glycol di(meth)acrylate, neopentyl glycol di(meth)acrylate, both-terminal (meth)acrylic acid adduct of bisphenol A diglycidyl ether, 1,4-butanediol di(meth)acrylate, 1,6-hexanediol di(meth)acrylate, pentaerythritol tri(meth)acrylate, pentaerythritol tetra(meth)acrylate, polyethylene glycol di(meth)acrylate, dipentaerythritol hexa(meth)acrylate, dipentaerythritol penta(meth)acrylate, dipentaerythritol tetra(meth)acrylate, ditrimethylolpropane tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO-modified bisphenol F di(meth)acrylate, (meth)acrylate of phenol novolak polyglycidyl ether, and the like.

Preferred radically polymerizable compounds are selected from the group consisting of bisphenol A diglycidylether diacrylate and mono-acrylate, dipentaerithritol hexacrylate and pentacrylate, trimethylolpropane triacrylate, neopentylglycol propoxylated diacrylate and isobornyl acrylate.

Each of the above mentioned radically polymerizable compounds can be used either individually or in combinations of two or more, or in combinations of at least one monofunctional monomer and at least one polyfunctional monomer.

The content of the radically polymerizable compound that may be used in the photocurable resin composition of the present invention is usually 0–45 wt %, preferably 3–35 wt %. Preferably polyfunctional acrylates, having functionality between 2 and 6 are used in the compositions of the present invention in amounts between 1 and 30, more preferably 2–20, most preferably between 3 and 15 wt %, relative to the total composition.

(E) Radical Photoinitiator

The compositions of the present invention may employ one or more free radical photoinitiators. Examples of photoinitiators include benzoins, such as benzoin, benzoin ethers, such as benzoin methyl ether, benzoin ethyl ether, and benzoin isopropyl ether, benzoin phenyl ether, and benzoin acetate, acetophenones, such as acetophenone, 2,2-dimethoxyacetophenone, 4-(phenylthio)acetophenone, and 1,1-dichloroacetophenone, benzil, benzil ketals, such as benzil dimethyl ketal, and benzil diethyl ketal, anthraquinones, such as 2-methylanthraquinone, 2-ethylanthraquinone, 2-tertbutylanthraquinone, 1-chloroanthraquinone, and 2-amylanthraquinone, also triphenylphosphine, benzoylphosphine oxides, such as, for example, 2,4,6-trimethylbenzoyidiphenylphosphine oxide (Lucirin TPO), benzophenones, such as benzophenone, dimethoxybenzophenone, diphenoxybenzophenone, and 4,4'-bis(N,N'-dimethylamino)benzophenone, thioxanthones and xanthones, acridine derivatives, phenazene derivatives, quinoxaline derivatives or 1-phenyl-1,2-propanedione-2-O-benzoyloxime, 1-aminophenyl ketones or 1-hydroxyphenyl ketones, such as 1-hydroxycyclohexyl phenyl ketone, phenyl (1-hydroxyisopropyl)ketone and 4-isopropylphenyl(1-hydroxyisopropyl)ketone, or triazine compounds, for example, 4'''-methyl thiophenyl-1-di(trichloromethyl)-3,5-S-triazine, S-triazine-2-(stilbene)-4,6-bistrichloromethyl, and paramethoxy styryl triazine, all of which are known compounds.

Especially suitable free-radical photoinitiators, which are normally used in combination with a He/Cd laser, operating at for example 325 nm, an Argon-ion laser, operating at for example 351 nm, or 351 and 364 nm, or 333, 351, and 364 nm, or a frequency tripled YAG solid state laser, having an output of 351 or 355 nm, as the radiation source, are acetophenones, such as 2,2-dialkoxybenzophenones and 1-hydroxyphenyl ketones, for example 1-hydroxycyclohexyl phenyl ketone, 2-hydroxy-1-{4-(2-hydroxyethoxy)phenyl}-2-methyl-1-propanone, benzophenone, or 2-hydroxyisopropyl phenyl ketone (also called 2-hydroxy-2,2-dimethylacetophenone), but especially 1-hydroxycyclohexyl phenyl ketone. Another class of free-radical photoinitiators comprises the benzil ketals, such as, for example, benzil dimethyl ketal. Especially an alpha-hydroxyphenyl ketone, benzil dimethyl ketal, or 2,4,6-trimethylbenzoyldiphenylphosphine oxide may be used as photoinitiator.

Another class of suitable free radical photoinitiators comprises the ionic dye-counter ion compounds, which are capable of absorbing actinic rays and producing free radicals, which can initiate the polymerization of the acrylates. The compositions according to the invention that comprise ionic dye-counter ion compounds can thus be cured in a more variable manner using visible light in an adjustable wavelength range of 400 to 700 nanometers. Ionic dye-counter ion compounds and their mode of action are known, for example from published European patent application EP 223587 and U.S. Pat. Nos. 4,751,102, 4,772,530 and 4,772,541. There may be mentioned as examples of suitable ionic dye-counter ion compounds the anionic dye-iodonium ion complexes, the anionic dye-pyryllium ion complexes and, especially, the cationic dye-borate anion compounds of the following formula (10)

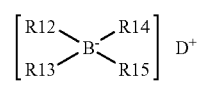

(10)

wherein $D^+$ is a cationic dye and $R_{12}$, $R_{13}$, $R_{14}$, and $R_{15}$ are each independently of the others alkyl, aryl, alkaryl, allyl, aralkyl, alkenyl, alkynyl, an alicyclic or saturated or unsaturated heterocyclic group. Preferred definitions for the radicals $R_{12}$ to $R_{15}$ can be found, for example, in published European patent application EP 223587.

Preferred free radical photoinitiators include 1-hydroxycyclohexyl phenyl ketone, 2-hydroxy-2-methyl-1-phenyl-propan-1-one, 2,2-dimethoxyacetophenone, benzophenone and 2,4,6-trimethylbenzoyldiphenylphosphine oxide. These photoinitiators alone or in combination with each other tend to be comparatively less yellowing.

Preferably, the present composition comprises, relative to the total weight of the composition, 0.1–15 wt % of one or more free radical photoinitiators, more preferably 1–10 wt %.

(F) Cationic Photoinititator

In the compositions according to the invention, any suitable type of photoinitiator that, upon exposure to actinic radiation, forms cations that initiate the reactions of the cationically polymerizable compounds, such as epoxy material(s), can be used. There are a large number of known and technically proven cationic photoinitiators that are suitable. They include, for example, onium salts with anions of weak nucleophilicity. Examples are halonium salts, iodosyl salts or sulfonium salts, such as are described in published European patent application EP 153904 and WO 98/28663, sulfoxonium salts, such as described, for example, in published European patent applications EP 35969, 44274, 54509, and 164314, or diazonium salts, such as described, for example, in U.S. Pat. Nos. 3,708,296 and 5,002,856. All eight of these disclosures are hereby incorporated in their entirety by reference. Other cationic photoinitiators are metallocene salts, such as described, for example, in published European applications EP 94914 and 94915, which applications are both hereby incorporated in their entirety by reference.

A survey of other current onium salt initiators and/or metallocene salts can be found in "UV Curing, Science and Technology", (Editor S. P. Pappas, Technology Marketing Corp., 642 Westover Road, Stamford, Conn., U.S.A.) or "Chemistry & Technology of UV & EB Formulation for Coatings, Inks & Paints", Vol.3 (edited by P. K. T. Oldring), and both books are hereby incorporated in their entirety by reference.

Preferred initiators include diaryl iodonium salts, triaryl sulfonium salts, or the like. Typical photo-polymerization initiators are represented by the following formulae (8) and (9):

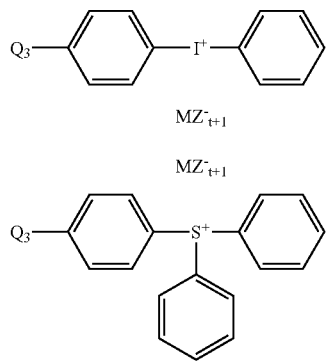

wherein $Q_3$ represents a hydrogen atom, an alkyl group having 1 to 18 carbon atoms, or an alkoxyl group having 1 to 18 carbon atoms;

M represents a metal atom, preferably antimony;

Z represents a halogen atom, preferably fluorine; and t is the valent number of the metal, for example 6 in the case of antimony.

Preferred cationic photoinitiators include iodonium photoinitiators, e.g. iodonium tetrakis (pentafluorophenyl) borate, because they tend to be less yellowing, especially when used in combination with photosensitizers such as, for instance, n-ethyl carbazole.

In order to increase the light efficiency, or to sensitize the cationic photoinitiator to specific wavelengths, such as for example specific laser wavelengths or a specific series of laser wavelengths, it is also possible, depending on the type of initiator, to use sensitizers. Examples are polycyclic aromatic hydrocarbons or aromatic keto compounds. Specific examples of preferred sensitizers are mentioned in published European patent application EP 153904. Other preferred sensitizers are benzoperylene, 1,8-diphenyl-1,3,5, 7-octatetraene, and 1,6-diphenyl-1,3,5-hexatriene as described in U.S. Pat. No. 5,667,937, which is hereby incorporated in its entirety by reference. It will be recognized that an additional factor in the choice of sensitizer is the nature and primary wavelength of the source of actinic radiation.

Preferably, the present composition comprises, relative to the total weight of the composition, 0.1–15 wt % of one or more cationic photoinitiators, more preferably 1–10 wt %.

(G) Hydroxy Functional Components

Most of the known compositions use hydroxy-functional compounds to enhance the properties of the parts made from the compositions. It has been surprisingly found, that the presence of hydroxy functional compounds that have no other cationically polymerizable functional group like an epoxy, oxetane or acrylate group, is not needed in the compositions of the present invention to obtain parts having excellent mechanical properties. Nevertheless, the present compositions may comprise suitable non-free radical polymerizable hydroxy-functional compounds.

The hydroxyl-containing material which can be used in the present invention may be any suitable organic material having a hydroxyl functionality of at least 1. The material is preferably substantially free of any groups which interfere with the curing reactions or which are thermally or photolytically unstable.

Any hydroxy group may be employed for the particular purpose. Preferably the hydroxyl-containing material contains one or more primary or secondary aliphatic hydroxyl. The hydroxyl group may be internal in the molecule or terminal. Monomers, oligomers or polymers can be used. The hydroxyl equivalent weight, i.e., the number average molecular weight divided by the number of hydroxyl groups, is preferably in the range of 31 to 5000.

Representative examples of hydroxyl-containing materials having a hydroxyl functionality of 1 include alkanols, monoalkyl ethers of polyoxyalkyleneglycols, mohoalkyl ethers of alkyleneglycols, and others, and combinations thereof.

Representative examples of useful monomeric polyhydroxy organic materials include alkylene and arylalkylene glycols and polyols, such as 1,2,4-butanetriol, 1,2,6-hexanetriol, 1,2,3-heptanetriol, 2,6-dimethyl-1,2,6-hexanetriol, (2R,3R)-(–)-2-benzyloxy-1,3,4-butanetriol, 1,2,3-hexanetriol, 1,2,3-butanetriol, 3-methyl-1,3,5-pentanetriol, 1,2,3-cyclohexanetriol, 1,3,5-cyclohexanetriol, 3,7,11,15-tetramethyl-1,2,3-hexadecanetriol, 2-hydroxymethyltetrahydropyran-3,4,5-triol, 2,2,4,4-tetramethyl-1,3-cyclobutanediol, 1,3-cyclopentanediol, trans-1,2-cyclooctanediol, 1,16-hexadecanediol, 3,6-dithia-1,8-octanediol, 2-butyne-1,4-diol, 1,3-propanediol, 1,4-butanediol, 1,5-pentanediol, 1,6-hexanediol, 1,7-heptanediol, 1,8-octanediol, 1,9-nonanediol, 1-phenyl-1,2-ethanediol, 1,2-cyclohexanediol, 1,5-decalindiol, 2,5-dimethyl-3-hexyne-2,5-diol, 2,7-dimethyl-3,5-octadiyne-2-7-diol, 2,3-butanediol, 1,4-cyclohexanedimethanol, and combinations thereof.

Representative examples of useful oligomeric and polymeric hydroxyl-containing materials include polyoxyethylene and polyoxypropylene glycols and triols of molecular weights from about 200 to about 10,000; polytetramethylene glycols of varying molecular weight; poly(oxyethyleneoxybutylene) random or block copolymers; copolymers containing pendant hydroxy groups formed by hydrolysis or partial hydrolysis of vinyl acetate copolymers, polyvinylacetal resins containing pendant hydroxyl groups; hydroxy-terminated polyesters and hydroxy-terminated polylactones; hydroxy-functionalized polyalkadienes, such as polybutadiene; aliphatic polycarbonate polyols, such as an aliphatic polycarbonate diol; and hydroxy-terminated polyethers, and combinations thereof.

Preferred hydroxyl-containing monomers include 1,4-cyclohexanedimethanol and aliphatic and cycloaliphatic monohydroxy alkanols. Preferred hydroxyl-containing oligomers and polymers include hydroxyl and hydroxyl/epoxy functionalized polybutadiene, polycaprolactone diols and triols, ethylene/butylene polyols, and monohydroxyl functional monomers. Preferred examples of polyether polyols are polypropylene glycols of various molecular weights and glycerol propoxylate-B-ethoxylate triol. Especially preferred are linear and branched polytetrahydrofuran polyether polyols available in various molecular weights, such as in the range of 150–4000 g/mol, preferably in the range of 150–1500 g/mol, more preferably in the range of 150–750 g/mol.

If present, the composition preferably comprises, relative to the total weight of the composition, at least 1 wt % of one or more non-free radical polymerizable hydroxy-functional compounds, more preferably at least 5 wt %, and most preferably at least 10 wt %. Furthermore, the composition preferably comprises, relative to the total weight of the composition, at most 60 wt % of one or more non-free radical polymerizable hydroxy-functional compounds, more preferably at most 40 wt %, and most preferably at most 25 wt %.

(H) Additives

Additives may also be present in the composition of the invention. Stabilizers are often added to the compositions in order to prevent a viscosity build-up, for instance a viscosity build-up during usage in a solid imaging process. Preferred stabilizers include those described in U.S. Pat. No. 5,665,792, the entire disclosure of which is hereby incorporated by reference. Such stabilizers are usually hydrocarbon carboxylic acid salts of group IA and IIA metals. Most preferred examples of these salts are sodium bicarbonate, potassium bicarbonate, and rubidium carbonate. Rubidium carbonate is preferred for formulations of this invention with recommended amounts varying between 0.0015 to 0.005% by weight of composition. Alternative stabilizers are polyvinylpyrrolidones and polyacrylonitriles. Other possible additives include dyes, pigments, fillers (e.g. silica particles—preferably cylindrical or spherical silica particles—, talc, glass powder, alumina, alumina hydrate, magnesium oxide, magnesium hydroxide, barium sulfate, calcium sulfate, calcium carbonate, magnesium carbonate, silicate mineral, diatomaceous earth, silica sand, silica powder, titanium oxide, aluminum powder, bronze powder, zinc powder, copper powder, lead powder, gold powder, silver dust, glass fiber, titanic acid potassium whisker, carbon whisker, sapphire whisker, beryllia whisker, boron carbide whisker, silicon carbide whisker, silicon nitride whisker, glass beads, hollow glass beads, metaloxides and potassium titanate whisker), antioxidants, wetting agents, photosensitizers for the free-radical photoinitiator, chain transfer agents, leveling agents, defoamers, surfactants and the like.

Applications

The present compositions are suitable for a wide variety of applications. For instance, the compositions can be used to prepare a three dimensional object by rapid prototyping. Rapid prototyping, sometimes also referred to as "solid imaging" or "stereolithography", is a process wherein a photoformable composition is coated as a thin layer upon a surface and exposed imagewise to actinic radiation such that the composition solidifies imagewise. This coating is most conveniently done if the composition is a liquid at room temperature, but a solid composition may also be melted to form a layer, or a solid or paste composition may be coated if it shows shear thinning behavior. Subsequently, new thin layers of photoformable composition are coated onto previous layers of exposed and unexposed composition. Then the new layer is exposed imagewise in order to solidify portions imagewise and in order to induce adhesion between portions of the new hardened region and portions of the previously hardened region. Each imagewise exposure is of a shape that relates to a pertinent cross-section of a photohardened object such that when all the layers have been coated and all the exposures have been completed, an integral photohardened object can be removed from the surrounding composition.

Accordingly, a rapid prototyping process can for instance be described as:

(1) coating a thin layer of a composition onto a surface;
(2) exposing said thin layer imagewise to actinic radiation to form an imaged cross-section, wherein the radiation is of sufficient intensity and time to cause substantial curing of the thin layer in the exposed areas;
(3) coating a thin layer of the composition onto the previously exposed imaged cross-section;
(4) exposing said thin layer from step (3) imagewise to actinic radiation to form an additional imaged cross-section, wherein the radiation is of sufficient intensity and time to cause substantial curing of the thin layer in the exposed areas and to cause adhesion to the previously exposed imaged cross-section;
(5) repeating steps (3) and (4) a sufficient number of times in order to build up the three-dimensional article.

EXAMPLES

Example 1

The effect of the presence of a cationically curable component with linking aliphatic ester groups on the hydrolytic stability of a part was determined with IR (infrared) analysis while the impact on mechanical properties was evaluated by TMA (thermomechanical analysis).

Blends of 3,4-Epoxy Cyclohexyl Methyl-3,4-Epoxy Cyclohexyl Carboxylate (UVI 1500) (Linking Ester Epoxy), and hydrogenated bisphenol A diglycidyl ether (Eponex 1510) (Epoxy 1), were mixed with 5% 3-Ethyl-3-(hydroxymethyl)oxetane (UVR6000) (Oxetane 1), and 0.6% Sulfonium,(thiodi-4,1-phenylene)bis[diphenyl-bis[(OC-6-11)hexafluoroantimonate(1-)]] CPI-6976 (Cationic Initiator 1).

The ratios of Linking Ester Epoxy to Epoxy 1 varied from 100% Linking Ester Epoxy to 100% Epoxy 1 in 20% increments.

For the IR study, one gram aliquots of each mixture were spiked with 0.02 g of perdeuterated dodecane. The D26 dodecane, available from Aldrich, was chosen as an internal standard because it absorbs in a distinct region in the IR and should be chemically inert. For the IR study a few drops of each deuterated formulation were placed between polymethylpentene plates and cured in a 10 bulb PCA (3 D Systems Post Curing Apparatus) for 60 minutes. The bulbs were Phillips TLK 40W/05 which had been used for ~1500 hours. Films of 20–30 micron thickness yielded well resolved IR spectra. These thin films were placed between pieces of the cured thick plates. The samples were heated at 35 deg. C for 28 hours in a closed plastic container with a pool of water on the bottom (the films were not in contact with the liquid water). IR spectra were then recorded for the films, and the procedure was repeated after an additional 21 hours humidity exposure. As a reference, films of some of the formulations were heated at 35° C. in a desiccated jar; IR spectra were also recorded for these films.

The extent of hydrolysis is indicated by the change in area of the —OH stretching absorbance (3100–3600 cm-1): hydrolysis of the ester groups in the Linking Ester Epoxy yields alcohol and carboxylic acid groups (both will absorb in the —OH region). In 25 micron thick films, the hydrolysis reaches an equilibrium value in no longer than 28 hours. The presence of the Epoxy 1 does not appear to affect the extent of hydrolysis of the Linking Ester Epoxy.

The thin films at 80 and 100% Linking Ester Epoxy were found to stick to the thick plates after humid conditioning and were noticeably more brittle.

The most obvious change in the IR spectra after humidity conditioning was an increase in absorbance in the OH region. Both the intensity and the breadth of the absorbance increased, with a shift in intensity towards lower energy. The peak areas were normalized against the areas of the CD (carbon-deuterium) stretch absorbance and against the —CH (carbon-hydrogen) stretch absorbance. Because of the relatively large error in determining the peak area of the —CD absorbance, the —CH absorbance was chosen as the internal reference. The increase in —OH absorbance at 28 hr. versus the initial value was found to be proportional to the amount of Linking Ester Epoxy in the formulation as shown in Table 1:

TABLE 1

| % of Linking Ester Epoxy | Increase of OH-absorbance after 28 hr |
|---|---|
| 100% | 8.5 |
| 80% | 9.2 |
| 60% | 5.2 |
| 40% | 5.2 |
| 20% | 3.4 |
| 0% | 3.1 |

This experiment indicates that hydrolysis of films prepared from blends of Linking Ester Epoxy and Epoxy 1 proceeds rapidly at 35 deg. C and high humidity.

This hydrolysis is accompanied by a loss of mechanical properties. The Linking Ester Epoxy/Epoxy 1 blends described above (without the deuterated dodecane) were used to measure the effect of humidity exposure on Flexural Modulus. Approximately 18 grams of each non-deuterated formulation were poured into polymethylpentene petri dishes (available from Nalge Nunc International, part number 5500-0010 which have a nominal size of 100 mm diameter and 15 mm height) and PCA cured for one hour. 10 mm long×3 mm wide samples were cut from the cured films. The samples were analyzed with a TA Associates TMA 2940 using a flexure probe. The stress on the sample is given by the equation $$S=3LF/(2bd^2)$$

where
S=Stress (MPa)
L=Sample length (mm)
F=Force exerted by TMA probe (N)
b=Sample width (mm)
d=Sample thickness (mm)

The sample strain is given by the equation $$r=6dD/L^2$$

where
D is the deflection of the surface of the sample at mid-span

The flex modulus is the stress divided by the strain $$E=(F/D)(L^3/4bd^3)$$

So for a given sample geometry, the modulus is directly proportional to the slope of the plot of applied force versus deflection.

The analysis was made at 30° C. with the force on the parts cycled twice from 0.01 to 0.5 N and back; the modulus was calculated from 0.05 to 0.1 N applied force. The average values for the two ramp-down cycles were used for the analysis. Between analyses, samples were kept in an oven at 35° C. Half the samples were kept in a desiccator jar while the other half were kept in high humidity. The modulus was measured of a sample, kept under high humidity condition (28 hours, 35 □C and 100% relative humidity (RH); wet condition) and compared with the modulus of a sample kept under dry conditions (35 □C having less than 10% RH). The Modulus Ratio (Wet/Dry) is the ratio of the value of the Modulus of the sample, kept under the wet condition to the value of the Modulus of the sample kept under the dry condition.

TABLE 2

| % Ester Linked Epoxy | Modulus Ratio (Wet/Dry) |
|---|---|
| 100 | 0.47 |
| 80 | 0.55 |
| 60 | 0.71 |
| 40 | 0.66 |
| 20 | N.D. |
| 0 | 0.85 |

TMA Results: Flexure modulus of samples maintained at high humidity are lower than those kept dry at 35 deg. C. As shown in Table 2, samples with high ester linked epoxy content have lower retained modulus than the low linking ester content samples.

Example 2

Humidity Effect on Hybrid Stereolithography Compositions

A composition of the present invention containing 59,4 wt % of Hydrogenated Bisphenol a-Ephichlorohydrin Based Epoxy Resin (Epoxy 1), 20 wt % of 3-Ethyl-3-(hydroxymethyl)oxetane (oxetane 1), 13 wt % of Dipentaerythritol Pentaacrylate (acrylate 1) and 1.75 wt % of a 1-Hydroxycyclohexyl phenyl ketone, and 5.85 wt % of Sulfonium, (thiodi-4,1-phenylene)bis[diphenyl-bis[(OC-6-11)hexafluoroantimonate(1-)]] is prepared as Resin A.

A comparative composition containing 55 wt % of 3,4 epoxy Cyclohexyl methyl-3,4-Epoxy Cyclohexyl carboxylate (UVI 1500), 18 wt % of a polytetrahydrofuran-polymer, 15 wt % of Dipentaerythritol Pentaacrylate, 5 wt % of propoxylated neopentyl glycol diacrylate, 5 wt % of Sulfonium,(thiodi-4,1-phenylene)bis[diphenyl-bis[(OC-6-11) hexafluoroantimonate(1-)]] and 1.6 wt % of a 1-Hydroxycyclohexyl phenyl ketone is prepared as Resin B.

The humidity resistance of a compositions of the instant invention (Resin A) is determined versus that of Resin B, containing a substantial amount (55 wt %) of Linking Ester Epoxy. In this experiment, ASTM D790 flex bars were fabricated by stereolithography means using the following conditions:

Fabricated flexural bar size approximately 5.5 mm thick, 12.5 mm wide, and 150 mm long. The coated layer thickness was ~150 micron. The exposure given each layer was 51 mJ/cm$^2$ for the Resin A and 47 mJ/cm$^2$ for the resin B. After fabrication by stereolithography the flexural bars were washed in isopropanol, then dried in air.

All the samples were postcure exposed in the 10 bulb PCA (3-D Systems Post Curing Apparatus) for 60 minutes.

After postcure, two of each composition's flexural bars were placed in vacuum bell jars which contained water saturated salt solutions or just water to achieve the desired humidity for storage. 100% RH was achieved with water in the base of the bell jar; 80% RH was achieved with a salt solution of Potassium Hydrogen Sulfate, Fused; 54% RH was achieved with Sodium Bisulfate Monohydrate; and 20% RH was achieved with Potassium Acetate saturated water solution. The samples were stored in the bell jars at room temperature (this is approximately 22° C.) for one month.

After one month, the samples were removed from the bell jars and immediately tested according to ASTM D790 (at approximately 22.6 Deg. C and 25% RH). Following are the results of the comparison:

| Humidity Storage Testing 1 month @ RH % Room Temp | Resin A Flex Modulus MPa | Resin B Flex Modulus Mpa |
| --- | --- | --- |
| 100% RH | 1666 | 97 |
| 80% RH | 1731 | 140 |
| 54% RH | 2110 | 741 |
| 20% RH | 2255 | 1508 |

A flexural bar made from Resin A, according to the present invention, retains approximately 74% of its flex modulus comparing the 20% RH and the 100% RH results. The flexural bar made from Resin B only retains 6.4% of its flex modulus comparing the 20% and 100% RH results.

Examples 3–20 and Comparative Experiment 1

Table 3 shows more non-limiting examples of the present inventions. Compositions have been prepared with the indicated components. After cure with actinic radiation and subsequent 60 min UV-postcure, mechanical analysis of the parts was performed.

| Component | Chemical Name | Component |
| --- | --- | --- |
| Linking Ester Epoxy | 3,4-Epoxy Cyclohexyl Methyl-3,4-Epoxy Cyclohexyl Carboxylate | UVR-1500 |
| Epoxy 1 | Hydrogenated Bisphenol a-Ephichlorohydrin Based Epoxy Resin | Eponex 1510 |
| Epoxy 2 | Bisphenol a-Ephichlorohydrin Based Epoxy Resin | Epon 825 |
| Epoxy 3 | Tetradecane Oxide | Vikolox 14 |
| Oxetane 1 | 3-Ethyl-3-(hydroxymethyl)oxetane | UVR-6000 |
| Acrylate 1 | Dipentaerythritol Pentaacrylate | SR-399 |
| Acrylate 2 | Propoxylated (2) Neopentyl Glycol Diacrylate | SR-9003 |
| Free Radical Initiator | 1-Hydroxycyclohexyl phenyl ketone | Ir-184 |
| Cationic Initiator 1 | Sulfonium,(thiodi-4,1-phenylene)bis[diphenyl-bis[(OC-6-11)hexafluoroantimonate(1-)]] | CPI 6976 |
| Cationic Initiator 2 | sulfonium,(thiodi-4,1-phenylene)bis[diphenyl-,bis[hexafluorophosphate(1-)]] | UVI-6990 |

Optionally, the compositions contain small amounts of stabilizer, antioxidant, surfactant and defoamer. The 1 day cured modulus is from tensile or Young's modulus data obtained from tensile bars made in a stereolithography machine. The bars were made in 150 um thick layers. Each cross-sectional layer of the tensile bar was given exposure sufficient to polymerize the composition at a 250 um depth (E10 exposure), providing approximately 100 um of overcure or engagement cure to assure adhesion to the previously coated and exposed layer. Comparative Example 1, Examples 3–14 and 18–20 were exposed with a laser emitting in the UV at 355 nm. Examples 15–17 were exposed with a laser emitting in the UV at 325 nm. The tensile bars were approximately 150 mm long and had a cross-section in the narrowed portion of approximately 1 cm square. The tensile tests were run according to ASTM D638 except that no provision was made for controlling the room temperature and humidity and the bars were not equilibrated for 2 days. Although the data is described as 1 day, some of data was obtained from 3–4 day old bars allowing for weekends and holidays. The Average Elongation @ Break % data is obtained from the same tensile bars. In general from 3–6 bars were used to obtain the data for each Example. The Toughness Factor is a multiplication of the Modulus times the Average Elongation @ Break % and may be interpreted as a measure of the toughness of the Example polymerized composition.

The Peak Polymerization Temperature Deg. C and the Coated Surface Temperature Deg. C was obtained using a Linear Laboratories C-600 E infrared thermometer pointed approximately at the center of a part under fabrication. The part was a 50 mm square and approximately 1.2 cm thick. The part was fabricated in 150 um thick layers and each layer was exposed to produce approximately 250 um of cure depth (E10 exposure) for the Example composition. The scanning speed was held constant at 1130 cm/sec with a 75 um spaced overlapping scan in one direction only. The laser power was controlled to ensure the proper cure depth for the composition. The Peak Polymerization Temperature is the highest temperature attained throughout part fabrication for the example formulation. The Coated Surface Temperature is the highest temperature measured on the part surface just after a new layer of composition was coated on the previous layer. The Temperature Delta Deg. C is the difference between the Peak Polymerization Temperature and the Coated Surface Temperature. The scanning speeds and laser powers used represent high speed scanning and high power laser scans.

| Component | Comp. Exp 1 | Example 3 | Example 4 | Example 5 | Example 6 | Example 7 | Example 8 | Example 9 | Example 10 |
|---|---|---|---|---|---|---|---|---|---|
| Linking Ester Epoxy | | | | | | | | | |
| Epoxy 1 | 79.645 | 74.645 | 69.095 | 64.995 | 59.395 | 54.895 | 49.895 | 44.905 | 39.905 |
| Epoxy 2 | | | | | | | | | |
| Epoxy 3 | | | | | | | | | |
| Oxetane 1 | | 5 | 10 | 15 | 20 | 25 | 30 | 35 | 40 |
| Acrylate 1 | 13 | 13 | 13 | 13 | 13 | 13 | 13 | 13 | 13 |
| Acrylate 2 | | | | | | | | | |
| Free Radical Initiator | 1.65 | 1.65 | 1.8 | 1.6 | 1.75 | 1.8 | 1.8 | 1.94 | 1.94 |
| Cationic Initiator 1 | 5.7 | 5.7 | 6.1 | 5.4 | 5.85 | 5.3 | 5.3 | 5.15 | 5.15 |
| Cationic Initiator 2 | | | | | | | | | |
| Total Composition | 100 | 100 | 100 | 100 | 100 | 100 | 100 | 100 | 100 |
| Oxetane/Epoxy Ratio | 0.00 | 0.10 | 0.22 | 0.35 | 0.52 | 0.70 | 0.92 | 1.19 | 1.53 |
| 1 day Cured Modulus MPa | 1737 | 2275 | 2572 | 2792 | 2696 | 2661 | 2613 | 2558 | 1751 |
| Ave. Elongation @ Break % | 10 | 7.5 | 3.1 | 4.8 | 6 | 5.9 | 9.8 | 8 | 26.2 |
| Toughness Factor MPA X % | 17375 | 17065 | 7972 | 13403 | 16175 | 15702 | 25609 | 20464 | 45884 |
| Ec mJ/cm^2 | 7.56 | 12.61 | 9.49 | 13.63 | 11.36 | 10.53 | 11.4 | 10.14 | 10.09 |
| Dp mm | 0.123 | 0.164 | 0.134 | 0.175 | 0.151 | 0.153 | 0.162 | 0.153 | 0.155 |
| E10 mJ/cm^2 | 59.78 | 59.31 | 62.99 | 58.2 | 61.15 | 55.45 | 54.85 | 53.04 | 52.18 |
| Peak Polymerization Temp. Deg. C. | 74 | 64 | 70 | 76 | 78 | 81 | 74 | 73 | 67 |
| Coated Surface Temperature Deg. C. | 54 | 50 | 50 | 52 | 52 | 54 | 52 | 51 | 51 |
| Temperature Delta Deg. C. | 20 | 14 | 20 | 24 | 26 | 27 | 22 | 22 | 16 |

| Component | Example 11 | Example 12 | Example 13 | Example 14 | Example 15 | Example 16 | Example 17 | Example 18 | Example 19 | Example 20 |
|---|---|---|---|---|---|---|---|---|---|---|
| Linking Ester Epoxy | | 7 | 10 | | | 7 | | | | |
| Epoxy 1 | | | | 62.525 | 59.9275 | 48.7474 | 54.7505 | 61.025 | 57.1238 | 59.9925 |
| Epoxy 2 | 62.495 | 46.695 | 43.615 | | | | | | | |
| Epoxy 3 | | | | | | 4 | 4 | | | 4 |
| Oxetane 1 | 20 | 32 | 30 | 16.50 | 23.5 | 23.5 | 23.5 | 16.00 | 18.73 | 19.5 |
| Acrylate 1 | 12 | 10 | 12 | 8 | 8 | 8 | 9 | 8 | 10 | 8 |
| Acrylate 2 | | | | 4 | 4 | 4 | 4 | 4 | 4 | 4 |
| Free Radical Initiator | 1.5 | 1.52 | 1.45 | 3.2 | 3 | 3.14 | 3.18 | 4 | 2.97 | 2.92 |
| Cationic Initiator 1 | 4 | 2.75 | 2.9 | 4.3 | 0.35 | 0.39 | 0.347 | | | 0.365 |
| Cationic Initiator 2 | | | | | | | | 5.5 | 5.7012 | |
| Total Composition | 100 | 100 | 100 | 100 | 100 | 100 | 100 | 100 | 100 | 100 |
| Oxetane/Epoxy Ratio | 0.49 | 1.06 | 1.06 | 0.40 | 0.60 | 0.69 | 0.62 | 0.40 | 0.50 | 0.47 |
| 1 day Cured Modulus MPa | 3344 | 3344 | 3447 | 2592 | 2806 | 2634 | 2461 | 2372 | 2392 | 2448 |
| Ave. Elongation @ Break % | 3.4 | 3.1 | 3.2 | 12.4 | 8.4 | 3.7 | 14.3 | 10.3 | 10.3 | 12.8 |
| Toughness Factor MPA X % | 11370 | 10366 | 11032 | 32146 | 23572 | 9745 | 35198 | 24430 | 24643 | 31330 |
| Ec mJ/cm^2 | 9.36 | 15.24 | 10.19 | 12.89 | 10.47 | 11.15 | 11.58 | 11.84 | 10.19 | 13.53 |
| Dp mm | 0.109 | 0.212 | 0.191 | 0.167 | 0.139 | 0.133 | 0.144 | 0.142 | 0.139 | 0.153 |
| E10 mJ/cm^2 | 95.1 | 50.59 | 38.51 | 58.97 | 65.33 | 75.45 | 67.39 | 70.62 | 63.26 | 70.79 |
| Peak Polymerization Temp. Deg. C. | | | | 72 | | | | | | |
| Coated Surface Temperature Deg. C. | | | | 52 | | | | | | |
| Temperature Delta Deg. C. | | | | 20 | | | | | | |

What is claimed is:

1. A radiation curable composition comprising relative to the total weight of the composition
   A 0–25 wt % of a cationically curable component having a linking aliphatic ester group
   B 10–85 wt % of an epoxy group containing component other than A
   C 1–50 wt % of an oxetane group containing component
   D 1–25 wt % of a multifunctional acrylate
   E a radical photoinitiator
   F a cationic photoinitiator.

2. The radiation curable composition according to claim 1, wherein component A comprises two cyclohexenoxide groups.

3. The radiation curable composition according to claim 1, wherein the amount of component A is between 0 and 15 wt %.

4. The radiation curable composition according to claim 1, wherein component B comprises a glycidyl ether group.

5. The resin composition according to claim 4, wherein the molar ratio of oxetane to glycidyl ether is between 0.1 and 1.5.

6. The radiation curable composition according to claim 4, wherein the composition contains a glycidyl ether of hydrogenated bisphenol A.

7. The resin composition according to claim 4, wherein the weight ratio of glycidyl ethers to epoxy-group containing components that have linking aliphatic ester groups is larger than 1.5

8. The radiation curable composition according to claim 1, wherein the composition comprises relative to the total weight of the composition 30–75 wt % of component B having a glycidyl ether group, 10–25 wt % of component C and 2–15 wt % of the multifunctional acrylate compound D.

9. The radiation curable component according to claim 1, wherein the oxetane is choosen from the group consisting of components defined by formula 2,

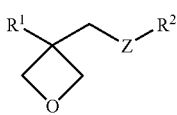

(2)

wherein $R^1$ is a C1–C4 alkyl group, Z=Oxygen and $R^2$=H, a C1–C8 alkyl group or a phenylgroup; 3-ethyl-3-hydroxymethyloxetane, (3-ethyl-3-oxetanylmethoxy)methylbenzene, (3-ethyl-3-oxetanylmethoxy)benzene, 2-ethylhexyl (3-ethyl-3-oxetanyl methyl) ether, 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl) ether and bis(3-ethyl-3-oxetanylmethyl) ether.

10. The radiation curable composition according to claim 1, wherein the composition after full cure with actinic radiation and 60 min UV postcure has at least one of the following properties
   (i) a flexural modulus in the range of 1000 to 100000 MPa;
   (ii) an average elongation at break of at least 4%; and
   (iii) a tensile strenght of at least 25 MPa.

11. The radiation curable composition according to claim 1, wherein a photo-fabricated article, obtained by repeating the steps of forming a layer of the composition and selectively irradiating the layer of the composition with actinic radiation, followed by postcure during 60 minutes in a postcure apparatus and subsequent conditioning of the article during 48 hours at a temperature of 20° C. and a relative humidity of 80% RH, has at least one of the following properties
   (i) a flexural modulus in the range of 500 to 10000 MPa;
   (ii) an average elongation at break of at least 3%; and/or
   (iii) a tensile strength of at least 25 MPa.

12. The resin composition according to claim 1, wherein the amount of components having linking aliphatic ester groups is less than 100 meq of ester links/100 g of composition.

13. The resin composition according to claim 1, wherein the amount of components having linking aliphatic ester groups is less than 25 meq of ester links/100 g of composition.

14. The composition according to claim 1, wherein the composition contains a filler.

15. A process for forming a three-dimensional article comprising:
   (1) coating a layer of a composition onto a surface, wherein the composition is used as defined in claim 1;
   (2) exposing the layer imagewise to actinic radiation to form an imaged cross-section, wherein the radiation is of sufficient intensity to cause substantial curing of the layer in the exposed areas;
   (3) coating a layer of the composition onto the previously exposed imaged cross-section;
   (4) exposing said thin layer from step (3) imagewise to actinic radiation to form an additional imaged cross-section, wherein the radiation is of sufficient intensity to cause substantial curing of the thin layer in the exposed areas and to cause adhesion to the previously exposed imaged cross-section;
   (5) repeating steps (3) and (4) a sufficient number of times in order to build up the three-dimensional article.

16. The process of claim 15, wherein the actinic radiation is in the range of 280–650 nm.

17. The process of claim 15, wherein the exposure energy is in the range of 10–150 mJ/cm.

18. A stereolithography resin having the composition of claim 1.

19. The radiation curable composition according to claim 1, wherein the amount of component A is 0–20 wt. %.

20. A radiation curable composition comprising relative to the total weight of the composition
   A a cationically curable component having a linking aliphatic ester group
   B 10–85 wt % of an epoxy group containing component other than A
   C 1–50 wt % of an oxetane group containing component
   D 1–25 wt % of a multifunctional acrylate
   E a radical photoinitiator
   F a cationic photoinitiator.
   wherein the amount of components having linking aliphatic ester groups is less than 100 meq of ester links/100 g of composition.

21. A radiation curable composition comprising relative to the total weight of the composition
   A 0–25 wt % of a component having a linking ester group and two cyclohexeneoxide groups
   B 10–85 wt % of an epoxy group containing component other than A
   C 1–29 wt % of an oxetane group containing component
   D 1–25 wt % of a multifunctional acrylate
   E 0,1–10 wt % of a radical photoinitiator
   F 0,1–10 wt % of a cationic photoinitiator
   wherein a photo-fabricated article, obtained by repeating the steps of forming a layer of the composition and selectively irradiating the layer of the composition with actinic radiation, followed by postcure during 60 minutes in a postcure apparatus and subsequent conditioning of the article during 48 hours at a temperature of 20° C. and a relative humidity of 80% RH, has at least one of the following properties
   (i) a flexural modulus in the range of 500 to 10000 MPa;
   (ii) an average elongation at break of at least 3%; and
   (iii) a tensile strength of at least 25 MPa.

22. The radiation curable composition according to claim 21, wherein the composition comprises 30–75 wt % of component B having a glycidyl ether group, 10–25 wt % of component C and 2–15 wt % of the multifunctional acrylate compound D.

* * * * *